US011849565B2

(12) United States Patent
Gao

(10) Patent No.: US 11,849,565 B2
(45) Date of Patent: Dec. 19, 2023

(54) TWO PHASE FLUID MANAGEMENT SYSTEM FOR DATA CENTER

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 175 days.

(21) Appl. No.: 17/559,961

(22) Filed: Dec. 22, 2021

(65) Prior Publication Data
US 2023/0200012 A1 Jun. 22, 2023

(51) Int. Cl.
H05K 7/20 (2006.01)

(52) U.S. Cl.
CPC ......... H05K 7/20318 (2013.01); H05K 7/203 (2013.01); H05K 7/20327 (2013.01); H05K 7/20381 (2013.01)

(58) Field of Classification Search
CPC ............... H05K 7/203; H05K 7/20318; H05K 7/20327; H05K 7/20818; H05K 7/20236; H05K 7/208; H05K 7/20272; H05K 7/2079; H05K 7/20781; F28D 15/0266; F28D 1/0417; F28D 2021/0028; G06F 1/20; G06F 2200/201

USPC ......................................................... 361/700
See application file for complete search history.

(56) References Cited

U.S. PATENT DOCUMENTS

| 2010/0307716 | A1* | 12/2010 | Bean, Jr. | ............ H05K 7/20745 165/80.2 |
| 2021/0153386 | A1* | 5/2021 | Lau | ........................ B66C 19/005 |
| 2023/0027552 | A1* | 1/2023 | Liu | ........................ H05K 7/203 |
| 2023/0073646 | A1* | 3/2023 | Gao | ........................ H05K 7/203 |
| 2023/0238611 | A1* | 7/2023 | Gao | .................... H01M 10/482 429/120 |

* cited by examiner

Primary Examiner — Mandeep S Buttar
(74) Attorney, Agent, or Firm — WOMBLE BOND DICKINSON (US) LLP

(57) ABSTRACT

A two-phase fluid management system, may include a sealed container and a mobile condenser that moves within the sealed container. The sealed container may include a plurality of input ports, each to receive a two-phase fluid as vapor from a respective one of a plurality of IT enclosures and a plurality of output ports, each to return the two-phase fluid as liquid to the respective one of the plurality of IT enclosures. The mobile condenser may be coupled to or include an actuator to move the mobile condenser to a respective one of a plurality of positions within the sealed container. An air intake and air outlet of the mobile condenser may form a sealed connection with a pair of condenser ports when the mobile condenser moves to the respective one of the plurality of positions.

20 Claims, 6 Drawing Sheets

FRONT VIEW

SIDE VIEW

TWO PHASE FLUID MANAGEMENT SYSTEM FOR DATA CENTER

FIELD

Embodiments of the present disclosure relate generally to information technology (IT) enclosures. In particular, a two-phase fluid management system may support a plurality of IT enclosures.

BACKGROUND

Information Technology (IT) includes technology such as computers that are accessible through the internet or a local network. IT equipment may be used to perform data storage, support front-end websites, back-end applications, services, and more. IT equipment, such as servers and other electronic components (e.g., peripheral devices), may be physically installed in a server chassis. These server chassis can then be installed in an IT enclosure, which may also be referred to as an IT rack. An IT enclosure may include electric, mechanical, and thermal management infrastructure that houses, cools, monitors, provides power to, and connects the IT equipment to the internet. A data center may be understood as a facility that is dedicated to supporting and housing many IT enclosures.

High power servers, such as, for example, servers that perform artificial intelligence based operations, may generate large amounts of thermal energy. These high power servers and server chassis that houses them, may be immersed in a fluid that absorbs thermal energy from the electronics. In this immersion cooling system, computer electronics can be immersed in, and in direct contact with, a non-electrically conductive fluid (e.g., a liquid). The temperature of this immersion fluid can be controlled within a defined 'safe range', for example, with a heat exchanger and pump, thereby cooling the IT equipment.

An IT enclosure that immerses the IT equipment in an immersion fluid can have a higher heat transfer capability than with traditional air and liquid cooling systems such as, for example, direct-to-chip thermal management using heat sinks or cold plates. Immersion cooling IT enclosures may greatly reduce the physical footprint of servers because the electronics can be packaged much closer together without overheating. As such, due to higher packaging density and increased computing load of electronics, IT enclosures with immersion cooling for high power density electronics is an attractive cooling solution. These IT enclosures, however, may have some drawbacks. Thus, a two-phase fluid management system that addresses such drawbacks may be beneficial.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required for a given aspect.

DETAILED DESCRIPTION

Figure 1:
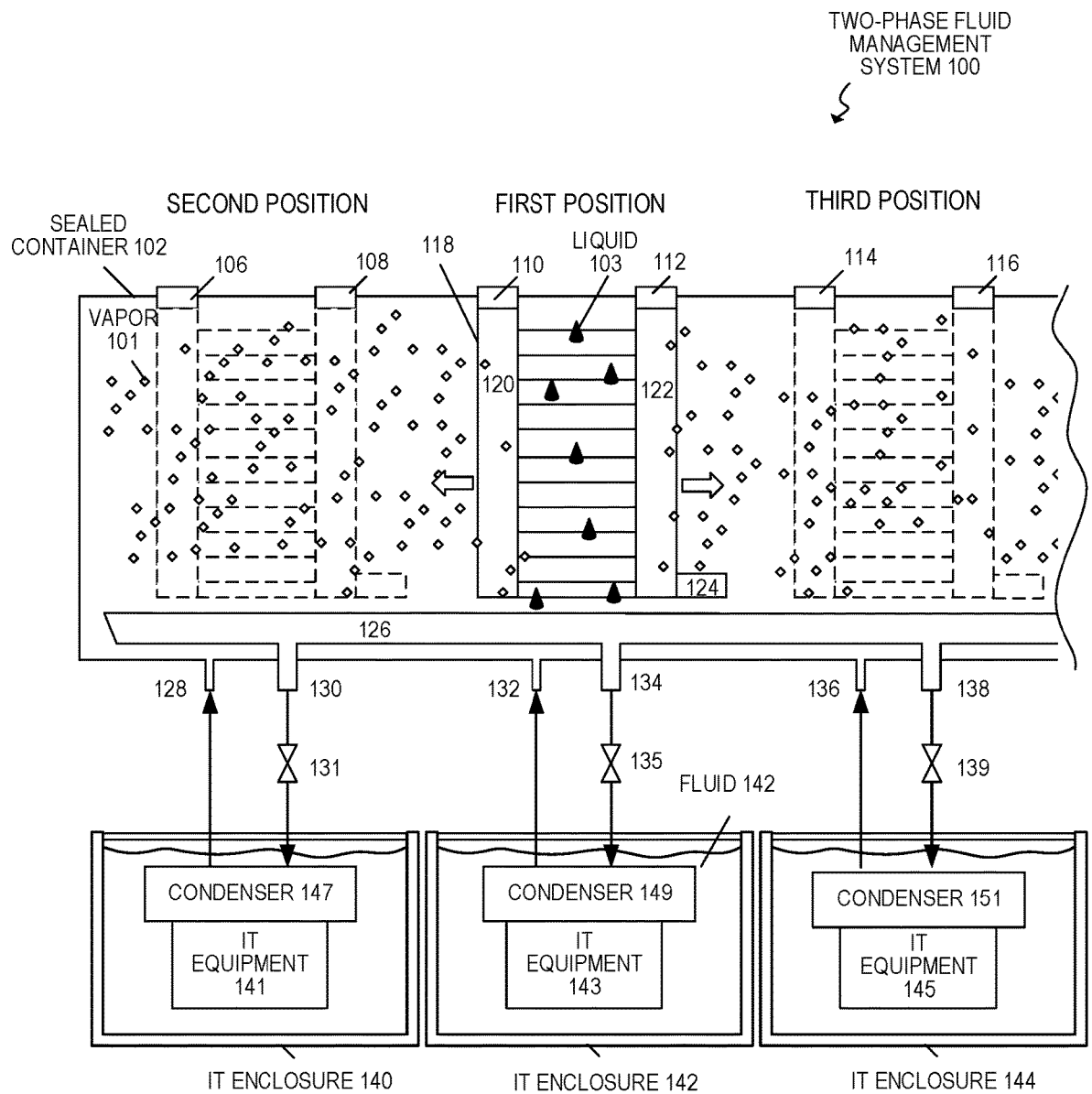
FIG. 1 shows a two-phase fluid management system, according to some embodiments.

Several aspects of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

An IT enclosure may be populated with a plurality of server chassis. Each server chassis may house one or more printed circuit boards that may be populated with electronic components such as, for example, integrated circuits (ICs), system on integrated chip (SOICs), processors, memory, resistors, capacitors, inductors, semi-conductors, power converters, and other electronic components. The electronic components may include hardware and/or software that may collectively form one or more servers that connect to the internet. Each server chassis can serve to manage power, thermal requirements, electronic connectivity, structural support, and other considerations of the server.

As discussed, power consumption for servers continues to increase, due to the growing needs of some applications such as, for example, artificial intelligence, blockchain, and other advanced applications. To support some applications, a server may include high power density chips. An IT enclosure may have a tank that holds a fluid in which the IT equipment is immersed in. Such IT enclosure may be referred to as an immersion tank.

An IT enclosure may include a two-phase fluid. A two-phase fluid may use a thermosiphon process to transfer thermal energy. In a thermosiphon process, the fluid may absorb thermal energy from IT equipment and, in the process, evaporate from liquid to vapor. Thermal energy may be absorbed from the vapor (e.g., by a mobile condenser as described herein) to convert the vapor back to liquid form. The liquid may again absorb thermal energy from the IT equipment and evaporate back to a vapor, and so on. Vapor, however, may be difficult to contain. Even with the utmost care, vapor may escape from an IT enclosure. Overtime, if enough vapor escapes, the IT enclosure may lack the requisite amount of fluid to keep the IT equipment cool.

Further, a data center may include many such IT enclosures. Monitoring and replenishing the fluid of each individual immersion-based IT enclosure may be difficult and inefficient. An architecture and design is disclosed that provides a safe, effective and efficient vapor management system for large-scale two-phase immersion-based IT enclosures.

Generally, a two-phase fluid management system may include a sealed container that includes a plurality of input ports, each to receive a two-phase fluid as vapor from a respective one of a plurality of IT enclosures (e.g., immersion tanks). The sealed container further includes a plurality of output ports, each to return the two-phase fluid as liquid to the respective one of the plurality of IT enclosures. The sealed container may serve as a shared reservoir of the two-phase fluid, and the vapor may travel freely throughout the sealed container.

A mobile condenser may reside within the sealed container. The mobile condenser may be coupled to an actuator to move the mobile condenser to a respective one of a plurality of positions within the sealed container. For example, a sealed container may have within it X number of positions in which the mobile condenser may move to. As described in other sections, each position can service at least one IT enclosure, and in some cases more.

An air intake of the mobile condenser forms a sealed connection with a first of a pair of condenser ports, and an air outlet of the mobile condenser forms a second sealed connection with a second of the pair of condenser ports when the mobile condenser moves to the respective one of the plurality of positions. As such, at each position within the sealed container, the mobile condenser mates with a respective pair of condenser ports to facilitate passage of air through the condenser from outside of the sealed container.

With such a system, rather than have a condenser for each IT enclosure, a single mobile condenser (or in some cases, more than one) may service many IT enclosures in an as-needed basis, reducing the total amount of hardware (e.g., a condenser for each IT enclosure). In addition, the sealed container may serve as a shared fluid reservoir which may distribute the fluid to any of the IT enclosures if one should run low on fluid.

In some embodiments, the two-phase fluid management system further includes one or more liquid collectors that are positioned underneath the plurality of positions within the sealed container. The liquid collector or collectors can collect the two-phase fluid that is condensed to the liquid by the mobile condenser and direct the liquid to at least one of the plurality of output ports.

In some embodiments, the pair of condenser ports located at each of the plurality of positions are closed when the mobile condenser is not at the respective one of the plurality of positions, and in response to the mobile condenser moving to the respective one of the plurality of positions, the pair of condenser ports are opened. As such, the fluid (in vapor form) within the sealed container does not escape.

In some embodiments, in response to the mobile condenser automatically being moved to the respective one of the plurality of positions, a blower is automatically activated to direct air into the air intake of the mobile condenser, through a cross-flow heat exchanger of the mobile condenser, and out of the air outlet of the mobile condenser, which condenses the two-phase fluid from the vapor to the liquid above the one or more liquid collectors.

In some embodiments, the first and the second of the pair of condenser ports at each of the plurality of positions includes a valve that opens and closes each respective condenser port. Additionally, the first and the second of the pair of condenser ports at each of the plurality of positions may include one or more rotating panels that rotates to open or close the respective condenser port. As such, the condenser ports may provide flow control through the valve, and an optional sealing functionality which may reduce the risk of vapor loss and reduce the cost of manufacturing low-tolerance hardware.

In some embodiments, at least one of the plurality of positions includes i) a first of the plurality of IT enclosures that is fluidly connected to a first of the plurality of input ports and a first of the plurality of output ports, and ii) a second of the plurality of IT enclosures that is fluidly connected to a second of the plurality of input ports and a second of the plurality of output ports, such that the mobile condenser receives, condenses and returns the two-phase fluid from and to the first of the plurality of IT enclosures and the second of the plurality of IT enclosures at the at least one of the plurality of positions. As such, a mobile condenser may service two or more IT enclosures at a given position within the sealed container.

In some embodiments, the two-phase fluid management system includes a controller which is configured to, in response to a sensed level of the two-phase fluid of the respective one of the plurality of IT enclosures falling below a threshold amount, move the mobile condenser to the respective one of the plurality of positions, and open a liquid valve arranged in line with a respective one of the plurality of outputs and a respective one of the IT enclosures. The controller may thus manage fluid levels of each IT enclosure in a targeted manner.

In some embodiments, the two-phase fluid management system includes a plurality of energy storage systems, each including a photovoltaic unit and a battery pack that is electrically coupled to the photovoltaic unit, wherein each of the plurality of energy storage systems provides electrical power to a blower or valves that are located at the respective one of the plurality of positions.

In some embodiments, the two-phase fluid management system includes a controller which is configured to move the mobile condenser to one of the plurality of positions based on a temperature at the one of the plurality of positions or based on an energy that is stored in a respective one of the plurality of energy storage systems that provides the electrical power to the blower or the valves at the one of the plurality of positions.

In some embodiments, the mobile condenser is coupled to one or more rails within the sealed container, and a position sensor or position lock is used to detect or align the mobile condenser in a respective one of the plurality of positions.

The two-phase fluid management system may include combinations of various embodiments described, including those that are shown in the example figures, as well as other combinations that may not be shown.

FIG. 1 shows a two-phase fluid management system 100, according to some embodiments. The two-phase fluid management system may address potential fluid loss for a plurality of IT enclosures (140, 142, 144) and perform cooling of fluid from each of the IT enclosures in an efficient manner with reduced parts.

The two-phase fluid management system 100 may include a sealed container 102. The sealed container may have one or more walls which may be joined to form an enclosed space within the sealed container in which vapor 101 may be housed and trapped within. The sealed container may be made from various combinations of suitable materials such as metals, plastics, composite materials, or other suitable materials. Similarly, the shape and size of the sealed container may vary depending on the application (e.g., depending on the size or layout of a deployment of IT enclosures). The sealed container may be fixed above a plurality of IT enclosures (e.g., 140, 142, and 144) such that vapor from each of the IT enclosures travels up to the sealed container and liquid falls down from the sealed container to each IT enclosure in an efficient manner.

Each of IT enclosures 140, 142, and 144 may have IT equipment 141, 143, and 145, respectively, each immersed in fluid 142 of their respective tanks. As such, IT enclosures 140, 142, and 144 may also be referred to as immersion tanks.

The sealed container may include a plurality of input ports (e.g., 128, 132, 136), each to receive a two-phase fluid 142 as vapor from a respective one of a plurality of IT enclosures. The sealed container may also include a plurality of output ports (e.g., 130, 134, 138) each to return the two-phase fluid as liquid to the respective one of the plurality of IT enclosures.

It should be understood that for the various embodiments disclosed, each port may include one or more fluid connectors. Further, the ports may be connected to IT enclosures through rigid or flexible conduit through which the fluid may travel through. The type and arrangement of connectors and conduit may vary depending on application.

A mobile condenser 118 is present within the sealed container. The mobile condenser 118 may be coupled to an actuator 124 that moves the mobile condenser to a respective one of a plurality of positions within the sealed container. An air intake 120 of the mobile condenser forms a sealed connection with a first port 110 of a pair of condenser ports (110, 112). An air outlet 122 of the mobile condenser 118 forms a second sealed connection with a second port 112 of the pair of condenser ports (110, 112) when the mobile condenser moves to the respective one of the plurality of positions.

As shown, vapor 101 may be free and unimpeded to flow throughout sealed container 102. Given the position of mobile condenser 118, most of the vapor 101 at the current position of the mobile condenser may be received through input port 132, however, vapor 101 may also be collected within the sealed container 102 from other IT enclosures (e.g., 140, 144) or other external fluid sources (not shown). This vapor will return the fluid as liquid 103. The liquid 103 may fall and be directed to IT enclosure 142 through output port 134. The mobile condenser, however, may move from one of the plurality of positions to another of the plurality of positions to condense vapor and return liquid to a respective one of the IT enclosures. As such, the IT enclosures may be serviced by a common condenser 118, and in a manner in which the fluid of an IT enclosure may be replenished from other IT enclosures, from an external fluid source, or a combination thereof. As the vapor at the first position decreases due to its condensation back to liquid, the vapor at other regions of the sealed container may move to the first position partially.

For example, the actuator 124 may move condenser 118 from the currently shown position (e.g., a first position) to a second position such that air intake 120 mates with condenser port 106 and air outlet 122 mates with condenser port 108. In this second position, the mobile condenser will condense vapor 101 that is primarily received from IT enclosure 140 through input port 128 (and also vapor 101 that is generally present in the sealed container), and return the fluid as liquid to IT enclosure 140 through output port 130.

Similarly, the actuator 124 may move condenser 118 to a third position such that air intake 120 mates with condenser port 114 and air outlet 122 mates with condenser port 116. In this third position, the mobile condenser 118 condenses vapor 101 that is received from IT enclosure 144 through input port 136 (and also vapor 101 that is generally present in the sealed container), and return the fluid as liquid to IT enclosure 144 through output port 138.

Actuator 124 may produce a motion of the mobile condenser 118 by converting energy into a motion based on a signal. The signal may be an activation signal (e.g., on/off), a position command, a speed command, or a combination thereof. The actuator 124 may produce a rotational motion (e.g., a rotary actuator) or linear motion (e.g., a linear actuator). Linear actuators can move forward or backwards in a given linear plane. Rotary actuators may revolve in a circular plane. Actuator 124 may have various power sources, for example, electrical, pneumatic, or hydraulic. In some examples, the actuator 124 may have a rotating wheel or gear that may be mechanically coupled to a belt or chain that is mechanically coupled to the mobile condenser 118. The rotational movement of the actuator may pull the mobile condenser back and forth in the sealed container, depending on the direction of rotation. In other examples, the actuator 124 may be directly fixed to the mobile condenser and have one or more wheels that rotate to move the mobile condenser like a train on tracks. The actuator mechanism and hardware that couples the actuator to the mobile condenser may vary depending on application.

An IT enclosure may have one or more sealed compartments (e.g., a tank) that holds the two-phase fluid and the IT equipment. As discussed, although the compartments may be sealed, due to the various fluid hardware such as, for example, conduit, connects, adaptors, valves, and other hardware, the IT enclosure may lose fluid. Each IT enclosure 140, 142, and 144 may have an internal condenser such as condensers 147, 149, and 151 respectively. Each of the internal condensers may condense a vapor form of fluid 142 to liquid within the respective IT enclosures. Some vapor may escape from the internal condensers, for example, as an intentional pressure release, through a leak in hardware, or because of other reasons. Such escaped vapor which is not condensed by the internal condensers may travel through vapor lines to input ports 128, 130, and 132, to the sealed container 102.

Figure 2:
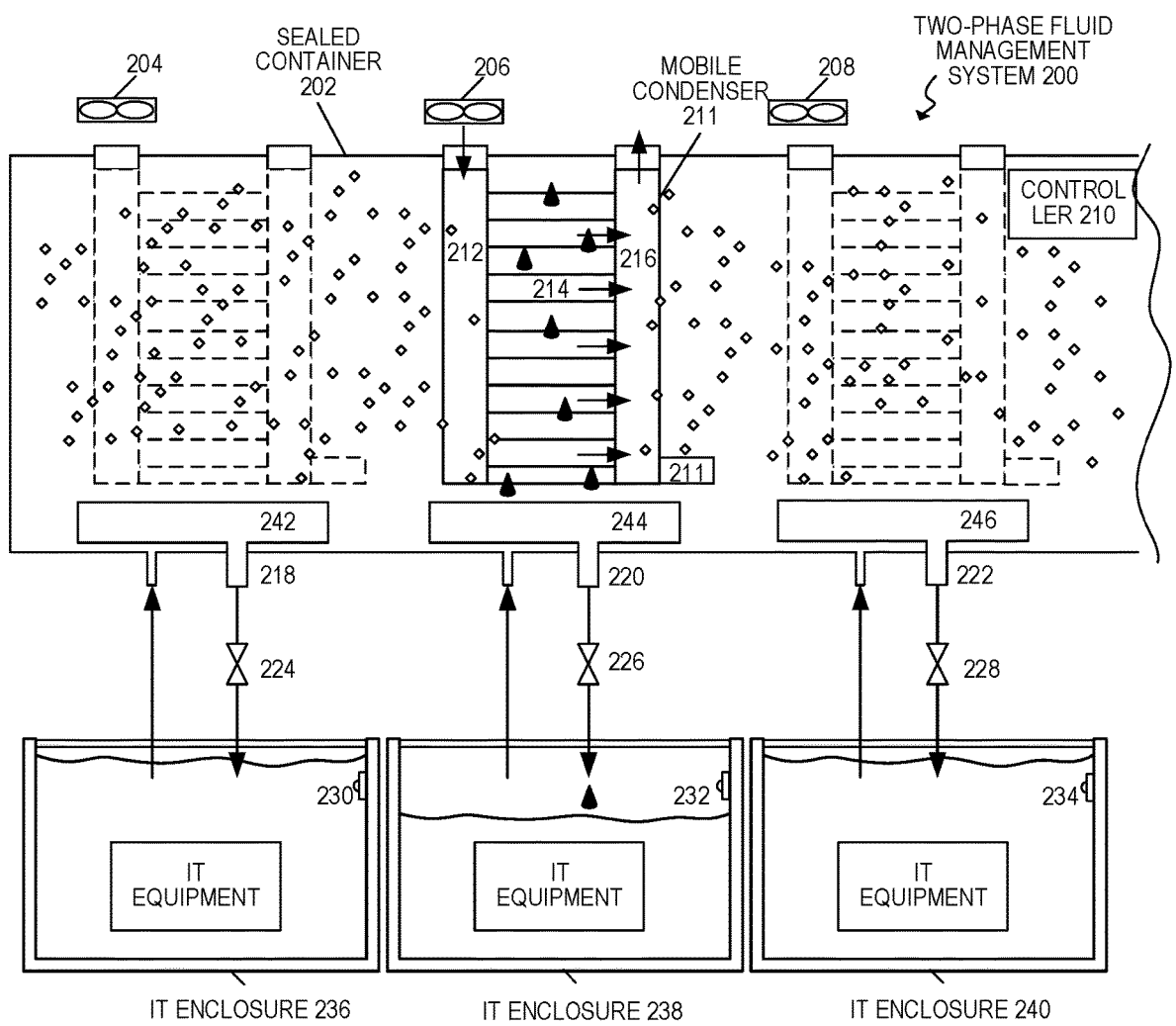
FIG. 2 shows a two-phase fluid management system with a controller and other features, according to some embodiments.

The two-phase fluid management system may include one or more liquid collectors 126 that are arranged underneath the plurality of positions within the sealed container, to collect the two-phase fluid that is condensed to the liquid by the mobile condenser and direct the liquid to at least one of the plurality of output ports. In some examples, the sealed container 102 may have a single liquid collector 126. This liquid collector may have a tray shape with sidewalls joined at a base to catch the liquid. The liquid collector may be open at the top to catch the liquid falling from the condenser. Further, the base of the liquid collector may have one or more sloped surfaces to direct the liquid towards the respective output port. For example, liquid collector 134 may have a sloped base so that when the mobile condenser is in the position shown, the liquid 103 that falls from the condenser is caught by the tray 126 and directed to output port 134. A residual amount of liquid 103 may still fall through the other output ports 130 and 138. In some aspects, the one or more liquid collectors may include a plurality of liquid collectors, such as having one at each output port as shown in FIG. 2 (liquid collectors 242, 244, 246). Each of these liquid collectors may also have a tray-shape, sloped base surfaces, or a combination thereof.

The pair of condenser ports located at each of the plurality of positions may be closed when the mobile condenser is not at the respective one of the plurality of positions, and in response to the mobile condenser moving to the respective one of the plurality of positions, the pair of condenser ports may be opened. Thus, the condenser ports may be coordinated based on the position of the mobile condenser.

For example, when the mobile condenser 118 is at the first position, the condenser ports 106 and 108 (at the second position) are closed. Similarly, the condenser ports 114 and 116 (at the third position) are closed. In response to the mobile condenser 118 moving to the second position, the condenser ports 106 and 108 open. The condenser ports 110 and 112 (at the first position) and the condenser ports 114 and 116 (at the third position) are closed. As such, the sealed container remains sealed to prevent escape of the vapor 101.

Although the two-phase fluid management system is shown in some examples, with three positions, it should be understood that the two-phase fluid management system may include more or less positions. The number of positions as well as the shape and size of the two-phase fluid management system may vary to suit a particular configuration of IT enclosures. They may be used modularly. For example, such as system may be placed over each row of IT enclosures, or over a plurality of rows of IT enclosures within a data center.

FIG. 2 shows a two-phase fluid management system 200 with a controller 210 and other features, according to some embodiments. As discussed herein, a mobile condenser 211 may be present within a sealed container 202. The mobile condenser may move throughout the sealed container (e.g., along a length of the sealed container) from one position to another. At each position, the mobile condenser condenses vapor from a corresponding on of the IT enclosures (e.g., enclosure 236, 238, and 240).

The two-phase fluid management system may include a controller 210 which is configured to, in response to a sensed level of the two-phase fluid of the respective one of the plurality of IT enclosures falling below a threshold amount, move the mobile condenser to the respective one of the plurality of positions, and open a liquid valve (224, 226, or 228) arranged in line with a respective one of the plurality of outputs and a respective one of the IT enclosures. The controller may move the mobile condenser through communication with an actuator 211. The controller may further control coordination of the condenser ports, as described with respect to FIG. 1.

For example, controller 210 may obtain sensor values from sensors 230, 232, and 234 of IT enclosures 236, 238, and 240 respectively. Each sensor can indicate whether the fluid in the IT enclosure is at a given level. Controller 210 may determine that the fluid level in IT enclosure 238 is below threshold amount (e.g., sensor 232 does not sense presence of fluid). The controller may command actuator 211 to move mobile condenser from one of the other positions to the currently shown position. Further, controller 210 may command valve 226 to open and command the remaining valves (e.g., valves 224 and 228) where the mobile condenser is not located, to close. In some examples, valves 242, 244, and 246 are optional and may not be implemented, such as when the sealed container includes a separate liquid collector for each IT enclosure. Operation of valves 242, 244, and 246 may be extended to other embodiments, such as for valves 131, 135, and 139 as shown in FIG. 1 where there is a common liquid collector 126 for IT enclosures.

Further, the controller 210 may command valve 226 to close in response to one or more criteria being met. For example, if the fluid level in IT enclosure 238 satisfies the threshold or a different threshold (e.g., higher than the first threshold), then the controller may command valve 226 to close. Further, if the controller senses that a different IT enclosure 236 falls below a threshold, the controller may move the mobile condenser the corresponding position (e.g., over liquid collector 242) and open valve 224. The remaining valves may be commanded closed. In such a manner, the controller may supply fluid to any of the IT enclosures based on fluid level, by moving the condenser to the respective position and opening the respective valve. The controller may close the valve when the fluid level for that respective IT enclosure reaches a satisfactory threshold.

The fluid sensing may be performed per IT enclosure with a variety of schemes. In some examples, each IT enclosure may have a plurality of sensors to sense the fluid levels with increased precision. Further, each IT enclosure may monitor the rate of fluid loss of the IT enclosure, based on an amount of fluid that is loss over a given time. The controller may obtain such information from each IT enclosure and control the components accordingly.

In some examples, in response to the mobile condenser automatically being moved to the respective one of the plurality of positions, a blower may be automatically activated (e.g., by controller 210) to direct air into the air intake 212 of the mobile condenser 211, through a cross-flow heat exchanger 214 of the mobile condenser 211, and out of the air outlet 216 of the mobile condenser. This process may condense the two-phase fluid from the vapor to the liquid above the one or more liquid collectors such as liquid collector 244 as shown. In some embodiments, the respective blower and valve may be activated concurrently, based on location of the mobile condenser. For example, the controller 210 may activate blower 204 and open valve 224 concurrently, when the mobile condenser 211 is positioned above IT enclosure 236. The remaining blowers 206, 208, and valves 226, 228 may be closed. In some examples, a blower (such as 204, 206, or 208) may directly attach to any of the condenser ports (e.g., 106, 108, 110, 112, 114, or 116). The blowers may be integrated as part of the ports, or attached to the ports, such that there are no gaps between the ports and the blowers.

Cross-flow heat exchanger 214 may include a plurality of thermally conductive channels (e.g., metal channels) that extend from the air intake 212 to the air outlet 216, through which the air from the blower flows through. Vapor within the sealed container come in contact with cross-flow heat exchanger (e.g., at a given position of the mobile condenser). The cross-flow heat exchanger 214 transfers thermal energy from the vapor to the air within the mobile condenser, thereby condensing the vapor to liquid at the given position.

Controller 210 may be communicatively coupled to the various components of the two-phase fluid management system (e.g., a sensor, an actuator, a blower, an energy storage system, or other component). The controller may communicate with components through inputs and outputs (e.g., analog or digital inputs or outputs), a communication bus, a network, or a combination thereof.

Figure 3:
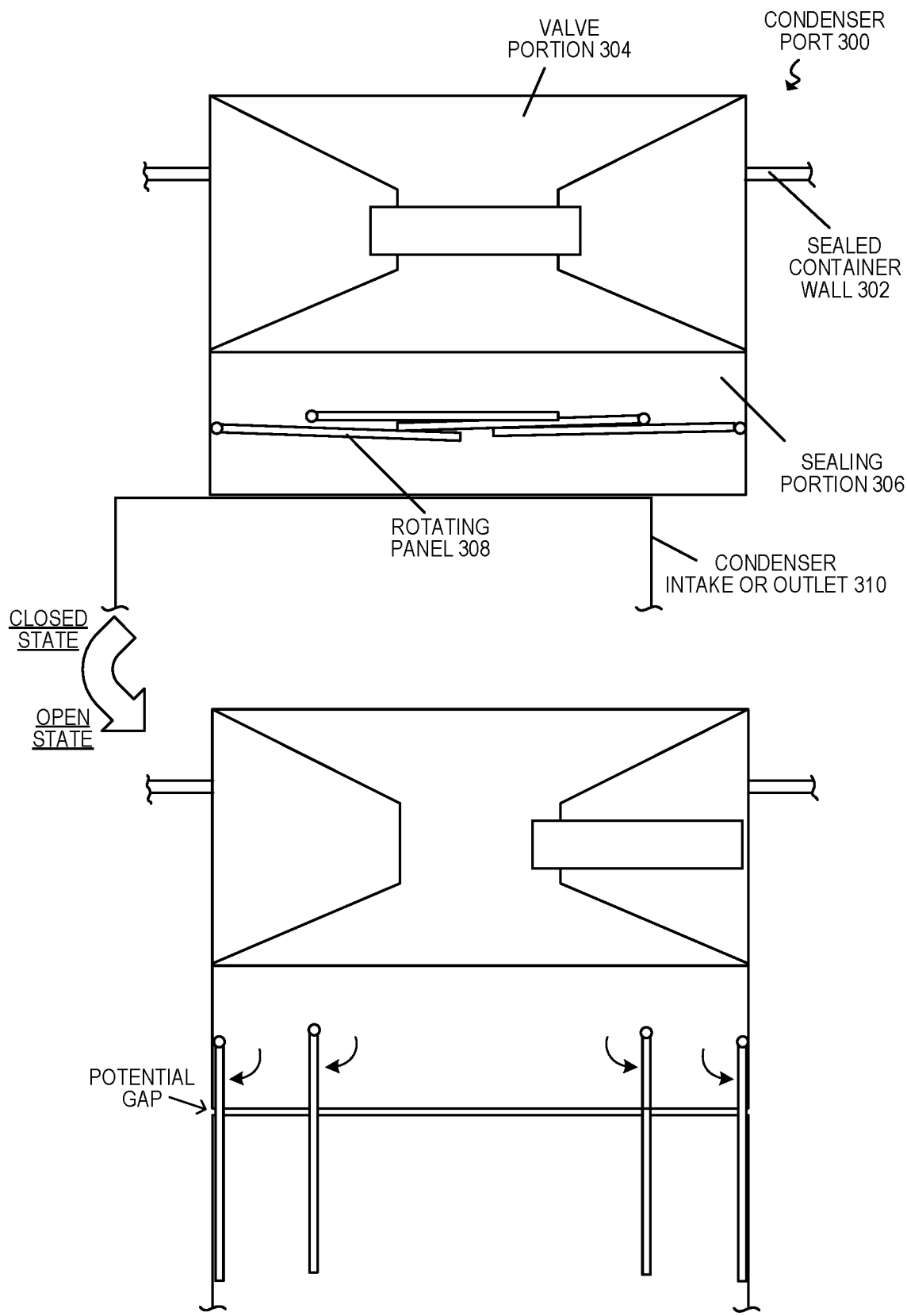
FIG. 3 shows closing and sealing condenser port, according to some embodiments.

FIG. 3 shows components of a condenser port 300, according to some embodiments. The condenser port is shown in the open position, and then the closed position.

Condenser port 300 may be used with any of embodiments discussed herein, such as for condenser ports 106, 108, 110, 112, 114, 116 in FIG. 1, as well as those in other embodiments. The condenser port 300 may be arranged at the sealed container wall 302 or the sealed container such that when the condenser port is open, air or other fluid may enter the sealed container through the condenser port.

The condenser port may include a valve portion 304 which includes a valve (e.g., an air valve) that prevents or allows the flow of air through the condenser port, thereby allowing air to flow through the mobile condenser when at a given position, but preventing vapor from escaping the sealed container when the mobile condenser is not at the given position. The valve may be commanded to open or close (e.g., remotely by a controller), thus opening or closing the port. As described herein, a controller may manage the state of each of the valves depending on the position of the mobile condenser.

Optionally, the condenser port may include a sealing portion 306 that includes one or more rotating panels 308 that rotates to open or close the port. The panels, which may also be referred to as slats, may rotate from a horizontal position to a vertical position, and vice versa. The sealing portion may rotate horizontally to seal the opening of the port as shown in the closed state, and rotate vertically to open the port. The rotating panels may have various orientations to seal potential gaps from each side of the port. In one embodiment, the sealing portion 306 is integral to the condenser intake 310. Valve portion 304 may be fixed to or integral to the sealed container wall 302. Sealing portion 306 may, in some embodiments, be integral to the condenser inlet or outlet 310, or, in other embodiments, be integral to the valve portion 304 (which in turn, may be integral to or fixed to the sealed container wall 302). In the case where the sealing portion is integral to the condenser intake and outlet 310, the sealing portion may open to the top (e.g., such that the rotating panels rotate upward toward the valve portion).

As shown, the condenser port 300 may maintain a closed state when the mobile condenser is not in its respective position, as shown by the condenser intake or outlet 310 being out of alignment with the condenser port in the closed state. In the closed state, the valve portion 304 may have the valve in a closed position. In some embodiments, the valve may include a solenoid activated valve. Other valve technology may be used. The sealing portion 306 may have rotating panels 308 in a horizontal position, thus providing an additional sealing layer to prevent escape of vapor from the sealed container through the port.

In the open state, the valve of valve portion 304 may open. The rotating panels 308 may take a vertical position such that the panels serve to seal potential gaps between the condenser air intake or outlet 310 and the inward facing opening of the condenser port, thus improving efficiency of the condenser and reducing vapor loss from the sealed container to the outside space. Further, the tolerance of the mobile condenser, condenser ports, and position of the mobile condenser within the sealed container may be increased with such a sealing feature.

Figure 4A:
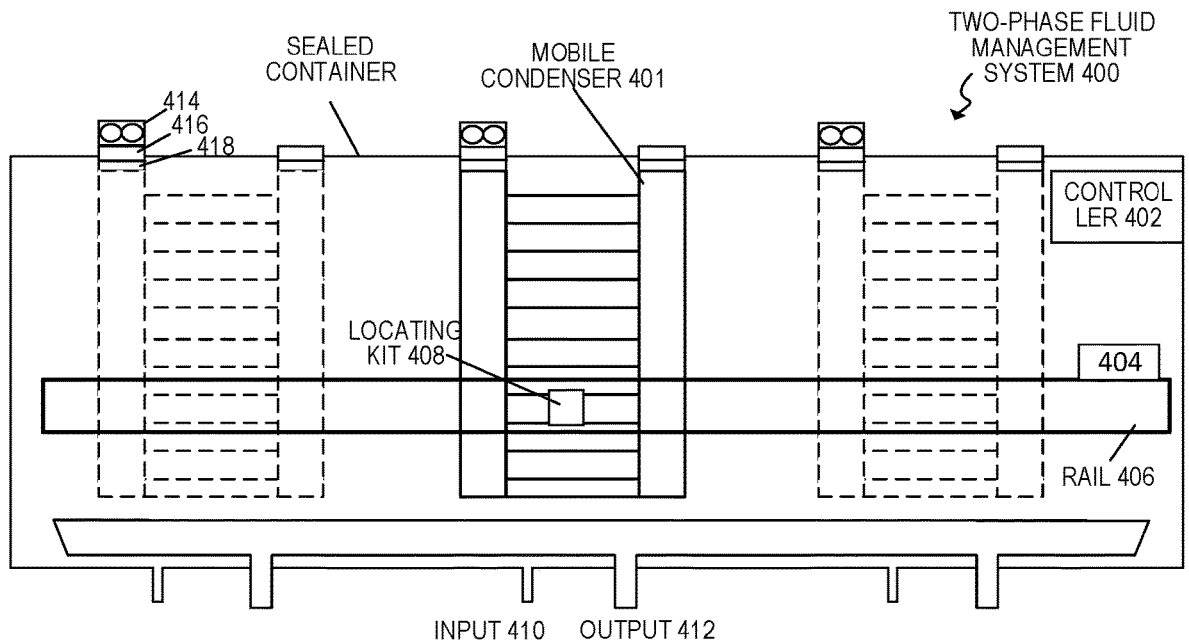
FIG. 4A and FIG. 4B show an aisle view and aisle end view of a two-phase fluid management system with a rail and other features, according to some embodiments.
Figure 4B:
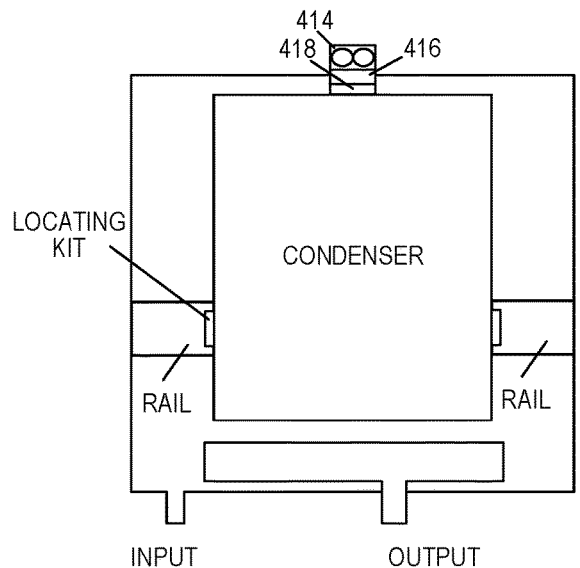

FIG. 4A and FIG. 4B shows a two-phase fluid management system with a rail 406 and other features, according to some embodiments. As discussed with respect to other embodiments, mobile condenser 401 may move from one position to another within the sealed container to condense fluid from vapor to liquid for a respective IT enclosure. FIG. 4A can be understood as a view when standing in an IT aisle, and FIG. 4B can be understood as a view standing at the end of the IT aisle.

The mobile condenser 401 may be coupled to one or more rails 404 within the sealed container. In some examples, a first of the one or more rails 404 connects to a first side of the condenser, and a second of the one or more rails 404 connects to an opposite side of the condenser. The condenser can move along the length of the rails within the sealed container. Controller 402 may operate actuator 404 to push, pull, or roll the condenser as guided by the one or more rails. The actuator may move the condenser with various hardware such as a belt, a chain, a wheel, a linear actuator, or other hardware.

In some examples, a locating kit 408 may be arranged in the rail to detect the position of the mobile condenser, align the mobile condenser, or a combination thereof. The locating kit may include a position sensor, a position lock, or a combination thereof. A position sensor may include a position switch, an ultrasonic sensor, and infrared (IR) sensor, a resistive sensor, an inductive or capacitive sensor, or other type of position or proximity sensor. The position lock may include latches, detents, indents, locks, clips, or other hardware that may guide or hold the mobile condenser in a given position along the rail.

In some embodiments, controller 402 may sense the position of the mobile condenser 401. If the position is deemed to be at a given position, the controller may, in response, operate the components as described, such as a) opening the condenser ports where the mobile condenser is positioned, and closing the remaining condenser ports, b) opening the liquid valve where the mobile condenser is positioned, and closing the remaining liquid valves, and c) activating the blower where the mobile condenser is positioned, and deactivating the remaining blowers. The controller 402 may communicate with the actuator to move the mobile condenser to a targeted position, and monitor if the position of the mobile condenser is at the targeted position based on feedback from the sensors. Similarly, the controller may operate each of the condenser ports. Each of the condenser ports may include a valve portion 416 and a sealing portion 418. As discussed, however, the sealing portion 418 may alternatively be fixed to or integrated as part of the mobile condenser intake and outlet. Each of the condenser ports may also include a blower 414 at the input condenser port (to push the air through the condenser) or the output condenser port (to pull the air out of the condenser) or both. Valve portion 416 may include the features described with respect to valve portion 304 in FIG. 3. Similarly, sealing portion 418 may include the features described with respect to sealing portion 306 in FIG. 3.

Figure 5:
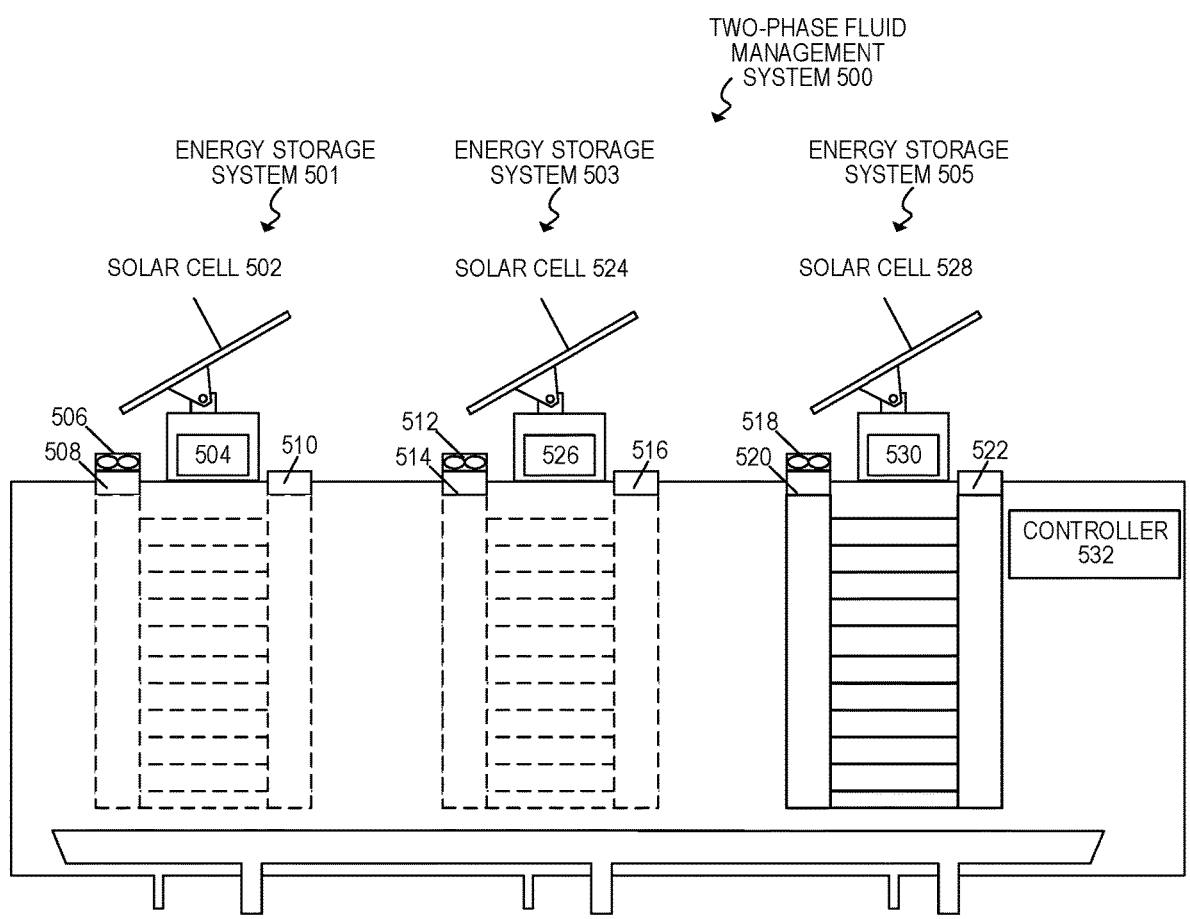
FIG. 5 shows a two-phase fluid management system with energy storage, according to some embodiments.

FIG. 5 shows a two-phase fluid management system 500 with energy storage, according to some embodiments. The system may include a plurality of energy storage systems such as 501, 503, and 505. Each storage system may include a respective one or more photovoltaic units (502, 524, 528), and respective battery pack 504, 526, and 530 that is electrically coupled to the photovoltaic unit and stores electrical energy captured by the respective photovoltaic units. Each energy storage system may further include electronic components such as DC/DC converters, battery management systems (BMS), and other electronic components that may support the storage and monitoring of energy in the respective battery packs. A photovoltaic unit may include a one or more photovoltaic cells that may be electrically connected in series, parallel, or a combination thereof, to provide a desired voltage and current output when converting solar energy to electrical energy.

Each of the energy storage systems may be dedicated to the components of a given position within the two-phase fluid management system. As such, each of the plurality of energy storage systems may provide electrical power to a blower or valves that are located at the respective one of the plurality of positions. For example, energy storage system 501 may power blower 506 and operation of condenser ports 508, 510. Energy storage system 503 may power blower 512 and operation of condenser ports 514 and 516. Energy storage system 505 may power blower 518 and operation of condenser ports 520 and 522.

A controller 532 may be configured to move the mobile condenser to one of the plurality of positions based on a temperature at the one of the plurality of positions or based on an energy that is stored in a respective one of the plurality of energy storage systems that provides the electrical power to the blower or the valves at the one of the plurality of positions.

For example, each of energy storage systems 501, 503, and 505 may include a temperature sensor. This temperature sensor may be used as an indication for how much solar energy is present at the respective solar cell. As such, controller 532 may move the mobile condenser to the position with highest temperature, or to one of a plurality of the positions that satisfy a threshold temperature.

For example, if a location of the energy storage system 505 has the highest ambient temperature, then controller 532 may move the condenser to that position. Similarly, if locations of the energy storage systems 501 and 503 both satisfy a threshold temperature, but energy storage system 505 does not, then controller 532 may move the condenser under energy storage system 503 or 501 in an alternating manner, or examine additional criteria to choose between the two positions (e.g., such as which has more energy stored in the battery, or which IT enclosure has a lower liquid level).

Additionally, or alternatively, the controller may simply move the condenser to the energy storage system with the highest energy stored in its respective battery pack. The total energy stored in a battery pack can be obtained from a battery management system of an energy storage system. This may be determined through open source voltage, integration of current over time, or a combination thereof.

In some embodiments, the controller may move the mobile condenser to a position where the energy storage system satisfies an energy stored threshold and a temperature threshold. Other criteria may be enforced to determine where to move the mobile condenser.

Figure 6:
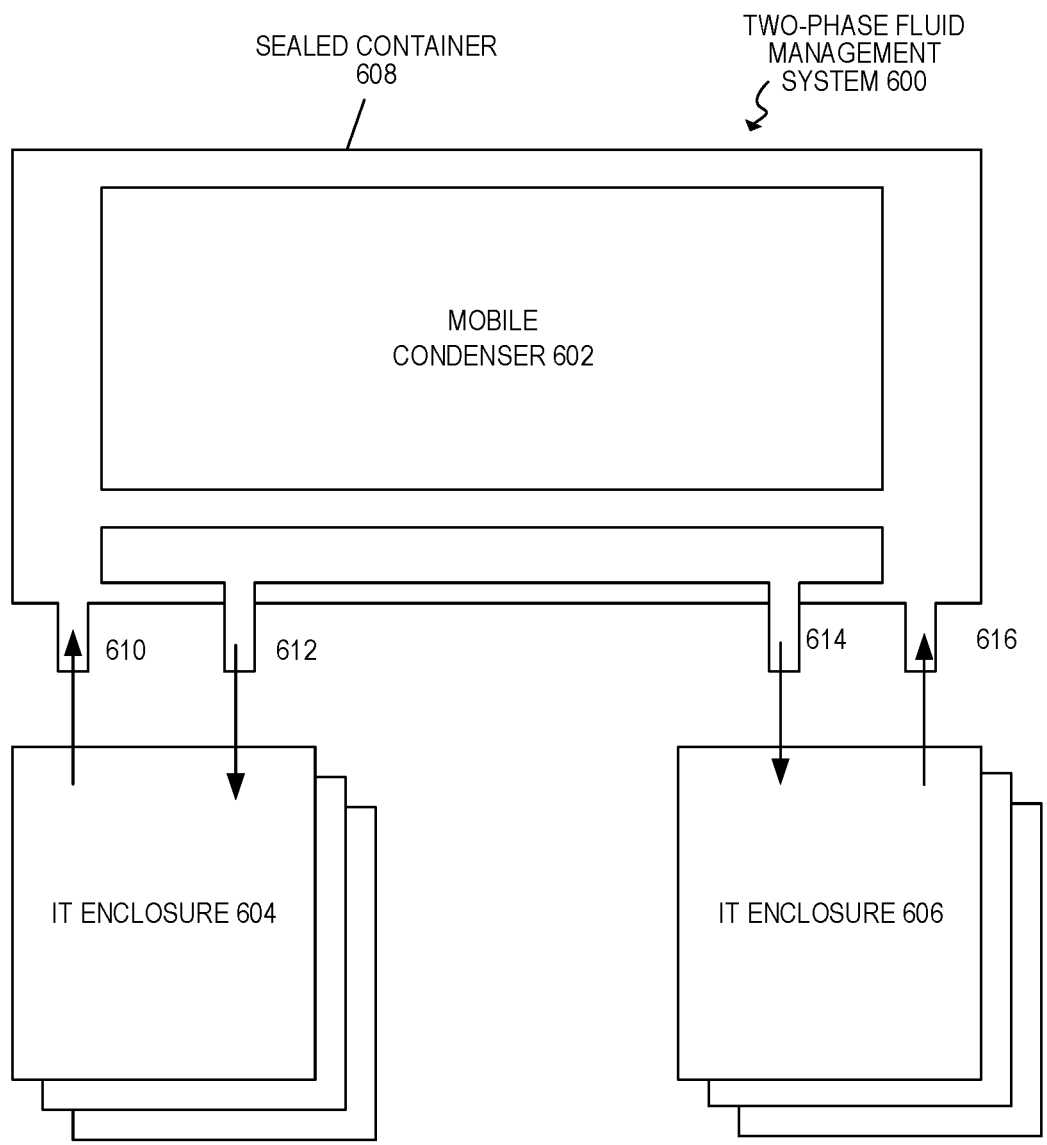
FIG. 6 a two-phase fluid management system with side-by-side IT enclosures, according to some embodiments.

FIG. 6 shows a two-phase fluid management system 600 with side-by-side IT enclosures, according to some embodiments. A mobile condenser 602 may move among a plurality of positions within a sealed container 604 as described in other embodiments.

In some embodiments, as shown here, the mobile condenser may support two IT enclosures in at least one of the plurality of positions. For example, in at least one of the positions of mobile condenser 602 within the sealed container 608, a first of the plurality of IT enclosures 604 is fluidly connected to a first of the plurality of input ports 610 and a first of the plurality of output ports 612, and a second of the plurality of IT enclosures 606 is fluidly connected to a second of the plurality of input ports 614 and a second of the plurality of output ports 616, such that the mobile condenser 602 receives, condenses and returns the two-phase fluid from and to both of the IT enclosures 604 and 602.

In some examples, IT enclosures may be placed in rows in a data center. IT enclosure 604 may be positioned in a first row, and IT enclosure 606 may be positioned in a second row that is adjacent to the first row. As such, a two-phase fluid management system 600 may have a sealed container 608 and a mobile condenser 602 that travels along the length of two adjacent rows, servicing two IT enclosures such as IT enclosures 604 and 606, at the same time.

As discussed herein, a data center may support a plurality of IT enclosures such as those described in the present disclosure. A data center may provide electricity, air conditioning, liquid cooling, fault monitoring, temperature monitoring, space, and other supporting infrastructure for each of the IT enclosures. For example, a data center may include one or more two-phase fluid management systems to support any number of IT enclosures.

Although not shown, an IT enclosure can, in some embodiments, include various other supporting components such as pumps, controllers, a power source, a back-up power source, and other components. As discussed, IT equipment may be assembled onto a server chassis, which can also be understood as a line replaceable unit (LRU) that can be placed into an array of server slots within an IT enclosure.

Each of the server chassis may house IT equipment such as one or more servers which may include one or more components such as, for example, central processing units or CPUs, graphical processing units (GPUs), memory, and/or storage devices. Each component may perform data processing tasks, where the component may include software installed in a storage device, loaded into the memory, and executed by one or more processors to perform the data processing tasks. At least some of these components may be attached to any of the cold plates as described above. A server may include a host server (referred to as a host node) coupled to one or more compute servers (also referred to as computing nodes, such as CPU server and GPU server). The host server (having one or more CPUs) typically interfaces with clients over a network (e.g., Internet) to receive a request fora particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

Aspects of the IT enclosure can be flexible and deployable in different system architectures; for example, the system can be deployed with a localized pumping system (e.g., a closed system architecture) or central pumping system (e.g., an open system architecture).

Some embodiments, for example, a controller as described in some embodiments, may include a non-transitory machine-readable medium (such as microelectronic memory) having stored thereon instructions, which program one or more data processing components (generically referred to here as a "processor") to perform operations described herein. In some embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain aspects have been described and shown in the accompanying drawings, it into be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A two-phase fluid management system, comprising:
    a sealed container including a plurality of input ports, each input port to receive a two-phase fluid as vapor from a respective one of a plurality of information technology (IT) enclosures and a plurality of output ports, each output port to return the two-phase fluid as liquid to the respective one of the plurality of IT enclosures; and
    a mobile condenser disposed within the sealed container, the mobile condenser coupled to an actuator to move the mobile condenser to a respective one of a plurality of positions within the sealed container,
    wherein an air intake of the mobile condenser forms a sealed connection with a first of a pair of condenser ports, and an air outlet of the mobile condenser forms a second sealed connection with a second of the pair of condenser ports when the mobile condenser moves to the respective one of the plurality of positions.

2. The two-phase fluid management system of claim 1, wherein the pair of condenser ports located at each of the plurality of positions on the sealed container are closed when the mobile condenser is not at the respective one of the plurality of positions, and in response to the mobile condenser moving to the respective one of the plurality of positions, the pair of condenser ports are opened.

3. The two-phase fluid management system of claim 1, further comprising one or more liquid collectors underneath the plurality of positions within the sealed container, to collect the two-phase fluid that is condensed to the liquid by the mobile condenser and direct the liquid to at least one of the plurality of output ports.

4. The two-phase fluid management system of claim 1, wherein in response to the mobile condenser automatically being moved to the respective one of the plurality of positions, a blower is automatically activated to direct air into the air intake of the mobile condenser, through a cross-flow heat exchanger of the mobile condenser, and out of the air outlet of the mobile condenser, which condenses the two-phase fluid from the vapor to the liquid above the one or more liquid collectors.

5. The two-phase fluid management system of claim 1, wherein the first and the second of the pair of condenser ports at each of the plurality of positions on the sealed container includes an air valve that operates the first and the second of the pair of condenser ports to open or close.

6. The two-phase fluid management system of claim 5, wherein the first and the second of the pair of condenser ports at each of the plurality of positions includes one or more rotating panels that rotates to open or close it.

7. The two-phase fluid management system of claim 1, wherein at least one of the plurality of positions includes
    a first of the plurality of IT enclosures that is fluidly connected to a first of the plurality of input ports and a first of the plurality of output ports, and
    a second of the plurality of IT enclosures that is fluidly connected to a second of the plurality of input ports and a second of the plurality of output ports, such that the mobile condenser receives, condenses and returns the two-phase fluid from and to the first of the plurality of IT enclosures and the second of the plurality of IT enclosures at the at least one of the plurality of positions.

8. The two-phase fluid management system of claim 1, further comprising a controller configured to,
    in response to a sensed level of the two-phase fluid of the respective one of the plurality of IT enclosures falling below a threshold amount, move the mobile condenser to the respective one of the plurality of positions; and
    open a liquid valve arranged in line with a respective one of the plurality of outputs and a respective one of the IT enclosures.

9. The two-phase fluid management system of claim 1, further comprising a plurality of energy storage systems, each energy storage system including a photovoltaic unit and a battery pack that is electrically coupled to the photovoltaic unit, wherein each of the plurality of energy storage systems provides electrical power to a blower or valves that are located at the respective one of the plurality of positions.

10. The two-phase fluid management system of claim 9, further comprising a controller configured to move the mobile condenser to one of the plurality of positions based on a temperature at the one of the plurality of positions or based on an energy that is stored in a respective one of the plurality of energy storage systems that provides the electrical power to the blower or the valves at the one of the plurality of positions.

11. The two-phase fluid management system of claim 1, wherein the mobile condenser is coupled to one or more rails within the sealed container, and a position sensor and position lock is used to detect or align the mobile condenser in a respective one of the plurality of positions.

12. A data center including:
    a plurality of information technology (IT) enclosures, each IT enclosure including IT equipment that is submerged in a two-phase fluid; and
    a two-phase fluid management system, comprising:
        a sealed container including a plurality of input ports, each input port to receive a two-phase fluid as vapor from a respective one of the plurality of IT enclosures and a plurality of output ports, each output port to return the two-phase fluid as liquid to the respective one of the plurality of IT enclosures, and
        a mobile condenser disposed within the sealed container, the mobile condenser coupled to an actuator to move the mobile condenser to a respective one of a plurality of positions within the sealed container,
        wherein an air intake of the mobile condenser forms a sealed connection with a first of a pair of condenser ports, and an air outlet of the mobile condenser forms a second sealed connection with a second of the pair of condenser ports when the mobile condenser moves to the respective one of the plurality of positions.

13. The data center of claim 12, wherein the pair of condenser ports located at each of the plurality of positions on the sealed container are closed when the mobile condenser is not at the respective one of the plurality of positions, and in response to the mobile condenser moving to the respective one of the plurality of positions, the pair of condenser ports are opened.

14. The data center of claim 12, wherein the two-phase fluid management system further comprises one or more liquid collectors underneath the plurality of positions within the sealed container, to collect the two-phase fluid that is condensed to the liquid by the mobile condenser and direct the liquid to at least one of the plurality of output ports.

15. The data center of claim 12, wherein in response to the mobile condenser being moved to the respective one of the plurality of positions, a blower is activated to direct air into the air intake of the mobile condenser, through a cross-flow heat exchanger of the mobile condenser, and out of the air outlet of the mobile condenser, which condenses the two-phase fluid from the vapor to the liquid above the one or more liquid collectors.

16. The data center of claim 12, wherein the first and the second of the pair of condenser ports at each of the plurality of positions includes an air valve that operates the first and the second of the pair of condenser ports to open or close.

17. The data center of claim 16, wherein one or more rotating panels on the mobile condenser rotates to open or close an intake or outlet of the mobile condenser.

18. The data center of claim 12, wherein at least one of the plurality of positions includes
a first of the plurality of IT enclosures that is fluidly connected to a first of the plurality of input ports and a first of the plurality of output ports, and
a second of the plurality of IT enclosures that is fluidly connected to a second of the plurality of input ports and a second of the plurality of output ports, such that the mobile condenser receives, condenses and returns the two-phase fluid from and to the first of the plurality of IT enclosures and the second of the plurality of IT enclosures at the at least one of the plurality of positions.

19. The data center of claim 12, wherein the two-phase fluid management system further comprises a controller which is configured to, in response to a sensed level of the two-phase fluid of the respective one of the plurality of IT enclosures falling below a threshold amount, move the mobile condenser to the respective one of the plurality of positions, and open a liquid valve arranged in line with a respective one of the plurality of outputs and a respective one of the IT enclosures.

20. The data center of claim 12, wherein the two-phase fluid management system further comprises a plurality of energy storage systems, each including a photovoltaic unit and a battery pack that is electrically coupled to the photovoltaic unit, wherein each of the plurality of energy storage systems provides electrical power to a blower or valves that are located at the respective one of the plurality of positions.

* * * * *